(12) United States Patent
Saito

(10) Patent No.: US 12,249,995 B2
(45) Date of Patent: Mar. 11, 2025

(54) DIFFERENTIAL INTERFACE CIRCUIT

(71) Applicant: ROHM CO., LTD., Kyoto (JP)

(72) Inventor: Shinichi Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 29 days.

(21) Appl. No.: 18/357,562

(22) Filed: Jul. 24, 2023

(65) Prior Publication Data

US 2024/0039522 A1 Feb. 1, 2024

(30) Foreign Application Priority Data

Jul. 26, 2022 (JP) .................... 2022-119056

(51) Int. Cl.
*H03K 5/24* (2006.01)
*H03F 3/45* (2006.01)
*H03K 7/02* (2006.01)

(52) U.S. Cl.
CPC ....... *H03K 5/2481* (2013.01); *H03F 3/45179* (2013.01); *H03K 7/02* (2013.01)

(58) Field of Classification Search
CPC ............ H03K 5/2481; H03K 7/02; H03K 19/017509; H03F 3/45179
See application file for complete search history.

(56) References Cited

U.S. PATENT DOCUMENTS

| | | | |
|---|---|---|---|
| 2021/0305981 A1* | 9/2021 | Eimitsu | H03K 19/00323 |
| 2022/0011352 A1* | 1/2022 | Rajavi | G01R 21/01 |
| 2022/0385444 A1* | 12/2022 | Yue | H03L 7/0812 |
| 2023/0336175 A1* | 10/2023 | Yao | H03K 19/0185 |

OTHER PUBLICATIONS

Rahman et al., 6.6: "A 22.5-to-32Gb/s 3.2pJ/b Referenceless Baud-Rate Digital CDR with DFE and CTLE in 28nm CMOS"; 2017 IEEE; 35 pages International Solid-State Circuits Conference.

* cited by examiner

*Primary Examiner* — Patrick O Neill
(74) *Attorney, Agent, or Firm* — CANTOR COLBURN LLP

(57) ABSTRACT

The first stage of the differential interface circuit includes a first transistor, a second transistor, a third transistor, and a fourth transistor. The gates of the first transistor and the second transistor are coupled to input terminals, respectively. The third transistor and the fourth transistor are coupled in parallel with the first transistor and the second transistor, respectively. The gate of the third transistor is coupled to the drain of the second transistor, and the gate of the fourth transistor is coupled to the drain of the first transistor.

7 Claims, 5 Drawing Sheets

DIFFERENTIAL INTERFACE CIRCUIT

CROSS REFERENCE TO RELATED APPLICATIONS

The present invention claims priority under 35 U.S.C. § 119 to Japanese Application, 2022-119056, filed on Jul. 26, 2022, the entire contents of which being incorporated herein by reference.

BACKGROUND

1. Technical Field

The present disclosure relates to a differential interface circuit.

2. Description of the Related Art

Although the non-return-to-zero (NRZ) method has been the mainstream of serial data transmission, applications that require higher transmission rate have employed the multi-level PAM method such as PAM4.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
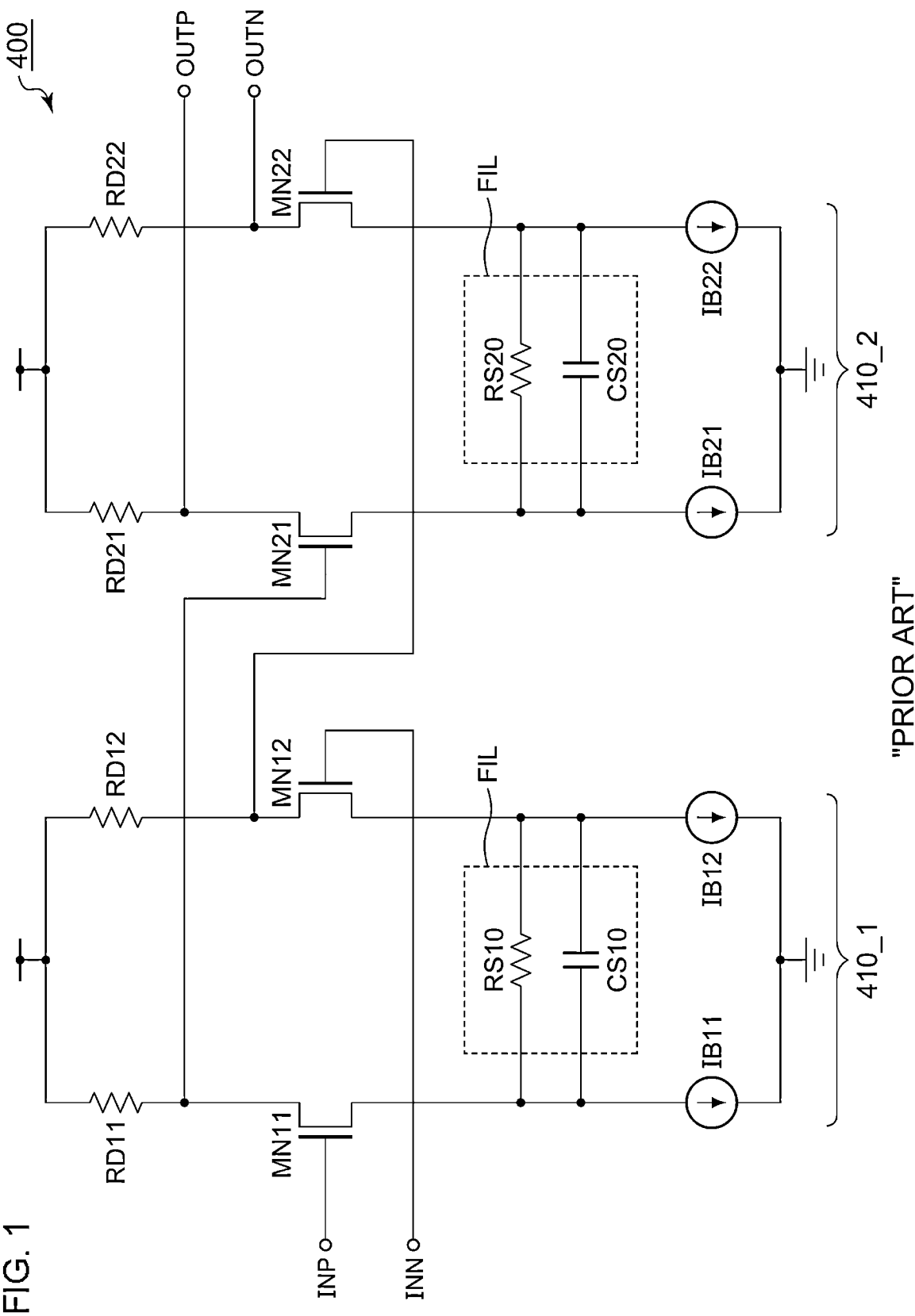
FIG. 1 is a circuit diagram illustrating a basic configuration of a differential interface circuit.

An outline of several example embodiments of the disclosure follows. This outline is provided for the convenience of the reader to provide a basic understanding of such embodiments and does not wholly define the breadth of the disclosure. This outline is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

In one embodiment, the differential interface circuit includes a first input terminal, a second input terminal, and a first stage. The first stage includes a first transistor having a gate coupled to the first input terminal, a second transistor having a gate coupled to the second input terminal, a first resistor coupled to a drain of the first transistor, a second resistor coupled to a drain of the second transistor, a first current source coupled to a source of the first transistor, a second current source coupled to a source of the second transistor, a third resistor coupled between the source of the first transistor and the source of the second transistor, a third transistor coupled in parallel to the first transistor and having a gate coupled to the drain of the second transistor, a fourth transistor coupled in parallel to the second transistor and having a gate coupled to the drain of the first transistor, a first capacitor coupled between the second input terminal and the source of the first transistor, and a second capacitor coupled between the first input terminal and the source of the second transistor.

With such structure having the third transistor and the fourth transistor added thereto, the differential interface circuit, when used in single-ended transmission, can reduce the potential difference of differential outputs (the drain of the first transistor and the drain of the second transistor) in the first stage. This successfully reduces distortion of the output waveform from the differential interface circuit.

Addition of the first capacitor and the second capacitor enables feed-through transmission of an input signal through these capacitors to the source, thus accelerating the signal transmission. This successfully compensates for any influence of phase difference due to propagation delay.

In one embodiment, the first stage may further contain a third capacitor coupled in parallel with the third resistor. With the third capacitor provided thereto, the first stage will have an equalizing characteristic for high frequency emphasis.

In one embodiment, the first stage may further include: a seventh resistor coupled in series with the first capacitor, between the second input terminal and the source of the first transistor; and an eighth resistor coupled in series with the second capacitor, between the first input terminal and the source of the second transistor. With such structure having the seventh resistor and the eighth resistor thus added thereto, the differential interface circuit, when used in single-ended transmission, can finely match the source phase of the first transistor on the signal input side, with the source phase of the second transistor on the non-signal input side.

In one embodiment, the differential interface circuit may further include a second stage coupled to the output stage of the first stage. The second stage may include a fifth transistor having a gate coupled to the drain of the first transistor; a sixth transistor having a gate coupled to the drain of the second transistor; a fourth resistor coupled to a drain of the fifth transistor; a fifth resistor coupled to a drain of the sixth transistor; a third current source coupled to a source of the fifth transistor; a fourth current source coupled to a source of the sixth transistor; a sixth resistor coupled between the source of the fifth transistor and the source of the sixth transistor; a seventh transistor coupled in parallel with the fifth transistor and having a gate coupled to the drain of the sixth transistor; and an eighth transistor coupled in parallel with the sixth transistor and having a gate coupled to the drain of the fifth transistor. In this structure, the potential difference of differential outputs (the drain of the fifth transistor and the drain of the sixth transistor) may be reduced also in the second stage. This further successfully reduces distortion of the output waveform from the differential interface circuit.

In one embodiment, the second stage may further contain a fourth capacitor coupled in parallel with the sixth resistor. This can provide the second stage with an equalizing characteristic for high frequency emphasis.

In one embodiment, the differential interface circuit may be integrally mounted on one semiconductor substrate. The term "integrally mounted" encompasses a case where all components of the circuit are formed on the semiconductor substrate, and a case where essential components of the circuit are integrally mounted, while allowing external provision, for example, of a part of resistors or capacitors for adjusting a circuit constant. The integration of the circuit on one chip can reduce the circuit area and can keep the characteristics of the circuit elements uniform.

A receiver according to one embodiment receives a multi-level PAM signal. The receiver may have any of the aforementioned differential interface circuits.

EMBODIMENTS

Preferred embodiments will be explained below, referring to the attached drawings. All similar or equivalent constituents, members and processes illustrated in the individual drawings will be given same reference numerals, so as to properly avoid redundant explanations. The embodiments are merely illustrative and are not restrictive about the invention. All features and combinations thereof described in the embodiments are not always necessarily essential to the disclosure and invention.

In the present specification, a "state in which member A is coupled to member B" includes a case where the member A and the member B are physically and directly coupled, and a case where the member A and the member B are indirectly coupled via some other member that does not substantially affect the electrically coupled state between the members A and B, or does not degrade the function or effect demonstrated by the coupling thereof.

Similarly, a "state in which member C is provided between member A and member B" includes a case where the member A and the member C, or the member B and the member C are directly coupled, and a case where they are indirectly coupled, while placing in between some other member that does not substantially affect the electrically coupled state among the members, or does not degrade the function or effect demonstrated by the members.

In the present specification, reference signs attached to electric signals such as voltage signal and current signal, or circuit elements such as resistor, capacitor, and inductor represent voltage value, current value, or circuit constants (resistance, capacitance, and inductance) of the individual components as necessary.

The present embodiment will explain a differential interface circuit suitable as a receiver that receives multi-level signal including PAM4 signal. First, a basic structure of the differential interface circuit will be explained.

FIG. 1 is a circuit diagram illustrating a basic configuration of a differential interface circuit 400. The differential interface circuit 400 has a plurality of stages 410_1 to 410_N. The number of stages N is possibly two, or three or more, and now a structure with N=2 will be illustrated.

Each of the stages 410_1 and 410_2 is structured to have a structure of the differential amplifier, to which a filter element FIL was further added.

The differential amplifier in the i-th (i=1, 2, . . . N) stage 410_i has load resistors RDi1, RDi2, input differential paired transistors MNi1, MNi2, and tail current sources IBi1 and IBi2.

The gates of the input differential paired transistors MNi1, MNi2 relate to differential input of each stage 410_i, and the drains of the input differential paired transistors MNi1, MNi2 relate to differential output of each stage 410_i.

The filter element FIL is coupled between the sources of the individual input differential paired transistors MNi1, MNi2. The filter element FIL contains a resistor RSi0 and a capacitor CSi0 connected in parallel.

The gates of the input differential paired transistors MN11, MN12 in the first stage 410_1 are connected to the differential input terminals INP, INN, respectively. Meanwhile, the gates of the input differential paired transistors MN21, MN22 in the second stage 410_2 are coupled to the differential outputs of the preceding first stage 410_1.

The differential interface circuit 400 is thus basically structured.

The present inventors examined the differential interface circuit 400 illustrated in FIG. 1, to find the following problems.

A transmitter and a receiver used for high-speed serial transmission have differential interfaces to be coupled via a cable (transmission path), to which applicable is not only differential wiring typically with use of twisted-pair cable, but also single-ended wiring typically with use of coaxial cable, for the purpose of weight reduction and cost reduction of the cable.

Figure 2:
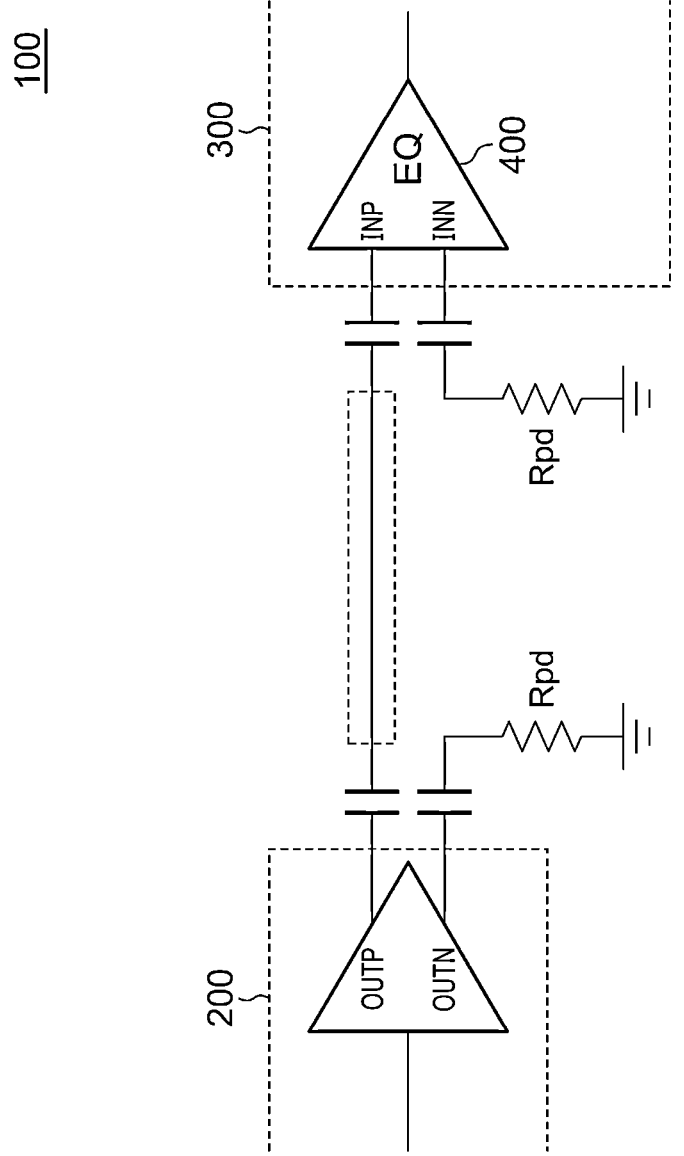
FIG. 2 is a block diagram of a transmission system having a transmitter and a receiver coupled by single-ended wiring.

FIG. 2 is a block diagram of a transmission system having a transmitter and a receiver coupled by single-ended wiring. Each of interface terminals of the transmitter 200 and the receiver 300 has a built-in termination resistor (50Ω), meanwhile each of the uncoupled terminals in the single-ended wiring has connected thereto an external resistor Rpd that simulates the termination resistor.

Assuming now the differential interface circuit 400 in FIG. 1 as the input interface circuit of the receiver in the transmission system 100 in FIG. 2, the INP will have signal input, meanwhile the INN will have no signal input, causing potential difference between two input signal waveforms, thus making the differential interface circuit 400 operate asymmetrically.

Furthermore, the INN having no signal input will operate in response to the operation of the INP having signal input, thus causing influence of propagation delay.

For these reasons, the differential interface circuit 400 in FIG. 1, when applied to the transmission system with the single-ended wiring, will cause the output signal having a heavily distorted differential waveform.

A binary serial transmission system can reduce such influence despite the distorted differential waveform, since the system may be binarized typically by providing, for example, a differential comparator having a large gain in the output stage. In contrast in a multi-level serial transmission system, provision of a differential circuit having a large gain will unfortunately result in loss of information of the multi-level signal.

The paragraphs below will explain a configuration of an equalizer circuit capable of solving the problem.

Embodiment 1

Figure 3:
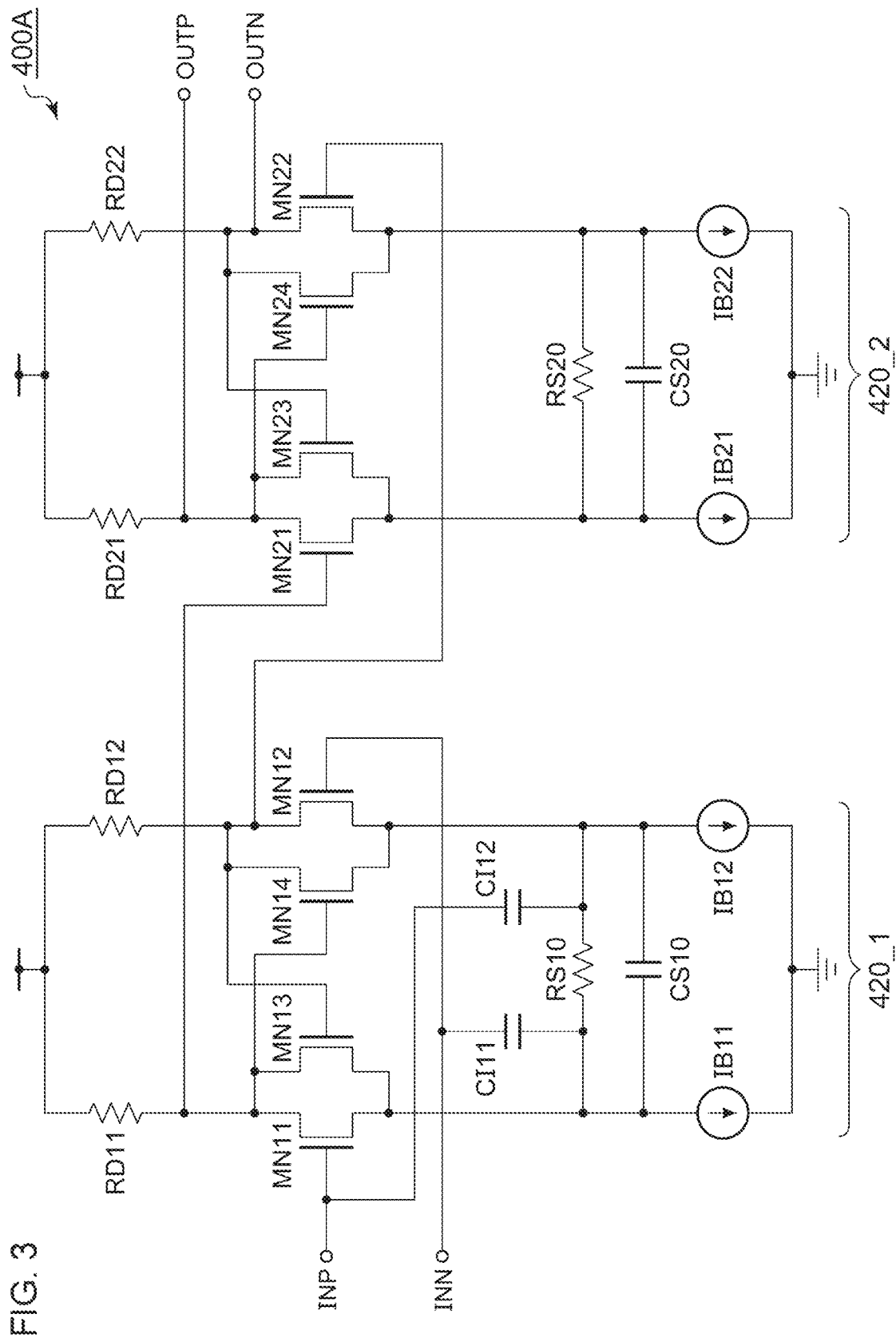
FIG. 3 is a circuit diagram of a differential interface circuit according to Embodiment 1.

FIG. 3 is a circuit diagram of a differential interface circuit 400A according to Embodiment 1. The differential interface circuit 400A has a plurality of stages 420_1 to 420_N. The number of stages N is possibly two, or three or more, and now a structure with N=2 will be illustrated. When N≥3 holds, a structure same as the second stage 420_2 may be repeatedly arranged.

The first stage 420_1 has the first transistor MN11, the second transistor MN12, a third transistor MN13, a fourth transistor MN14, a first resistor RD11, a second resistor RD12, a third resistor RS10, a first current source IB11, a second current source IB12, the first capacitor CI11, the second capacitor CI12, and a third capacitor CS10.

The first stage 420_1 will be detailed. The first transistor MN11 and the second transistor MN12 constitute an input differential pair, with the gate of the first transistor MN11 coupled to the input terminal INP of the differential interface circuit 400A, and with the gate of the second transistor MN12 coupled to the input terminal INN of the differential interface circuit 400A.

The first resistor RD11 is coupled between the drain of the first transistor MN11 and the power source line, and the second resistor RD12 is coupled between the drain of the second transistor MN12 and the power source line. The first current source IB11 is coupled between the source of the first transistor MN11 and the ground, and the second current source IB12 is coupled between the source of the second transistor MN12 and the ground.

The third transistor MN13 and the fourth transistor MN14 are feedback transistors. The first transistor MN11 and the second transistor MN12 have the same conduction type (N-channel). The drain of the third transistor MN13 is coupled to the drain of the first transistor MN11, and the source of the third transistor MN13 is coupled to the source of the first transistor MN11. The gate of the third transistor MN13 is coupled to the drain of the second transistor MN12, through which one of the differential outputs of the first stage 420_1 is fed back.

Similarly, the drain of the fourth transistor MN14 is coupled to the drain of the second transistor MN12, and the source of the fourth transistor MN14 is coupled to the source of the second transistor MN12. The gate of the fourth transistor MN14 is coupled to the drain of the first transistor MN11, through which one of the differential outputs of the first stage 420_1 is fed back.

The third resistor RS10 is coupled between the source of the first transistor MN11 and the source of the second transistor MN12. The third capacitor CS10 is coupled between the source of the first transistor MN11 and the source of the second transistor MN12, and in parallel with the third resistor RS10.

That is, the first stage 420_1 is understood to have the first stage 410_1 illustrated in FIG. 1, to which the third transistor MN13 and the fourth transistor MN14 were further added.

The first stage 420_1 has the first capacitor CI11 and the second capacitor CI12, which are added further in addition to the third transistor MN13 and the fourth transistor MN14. The first capacitor CI11 is coupled between the differential input terminal INN and the source of the first transistor MN11. The second capacitor CI12 is coupled between the differential input terminal INP and the source of the second transistor MN12.

Next, the second stage 420_2 will be explained.

The second stage 420_2 has a fifth transistor MN21, a sixth transistor MN22, a seventh transistor MN23, an eighth transistor MN24, a fourth resistor RD21, a fifth resistor RD22, a sixth resistor RS20, a third current source IB21, a fourth current source IB22, and a fourth capacitor CS20.

The second stage 420_2 is therefore understood to have a structure of the second stage 410_2 illustrated in FIG. 1, to which the seventh transistor MN23 and the eighth transistor MN24 were further added. The second stage 420_2 is also understood to have a structure of the first stage 420_1, from which the first capacitor CI11 and the second capacitor CI12 were omitted.

The differential interface circuit 400A according to the embodiment is thus structured. Next, the advantage will be explained.

With the feedback transistors MNi3, MNi4 added to each stage 420_i (i=1, 2, . . . N), the differential interface circuit 400A illustrated in FIG. 3 can reduce the potential difference of the differential output stage by stage.

Further with the first capacitor CI11 added between the differential input terminal INN and the source of the first transistor MN11, and with the second capacitor CI12 added between the differential input terminal INP and the source of the second transistor MN12, the first stage 420_1 can feed through the input signal through these capacitors CI11, CI12 to the sources, thereby accelerating the signal transmission. This successfully compensates for any influence of phase difference due to propagation delay.

Embodiment 2

Figure 4:
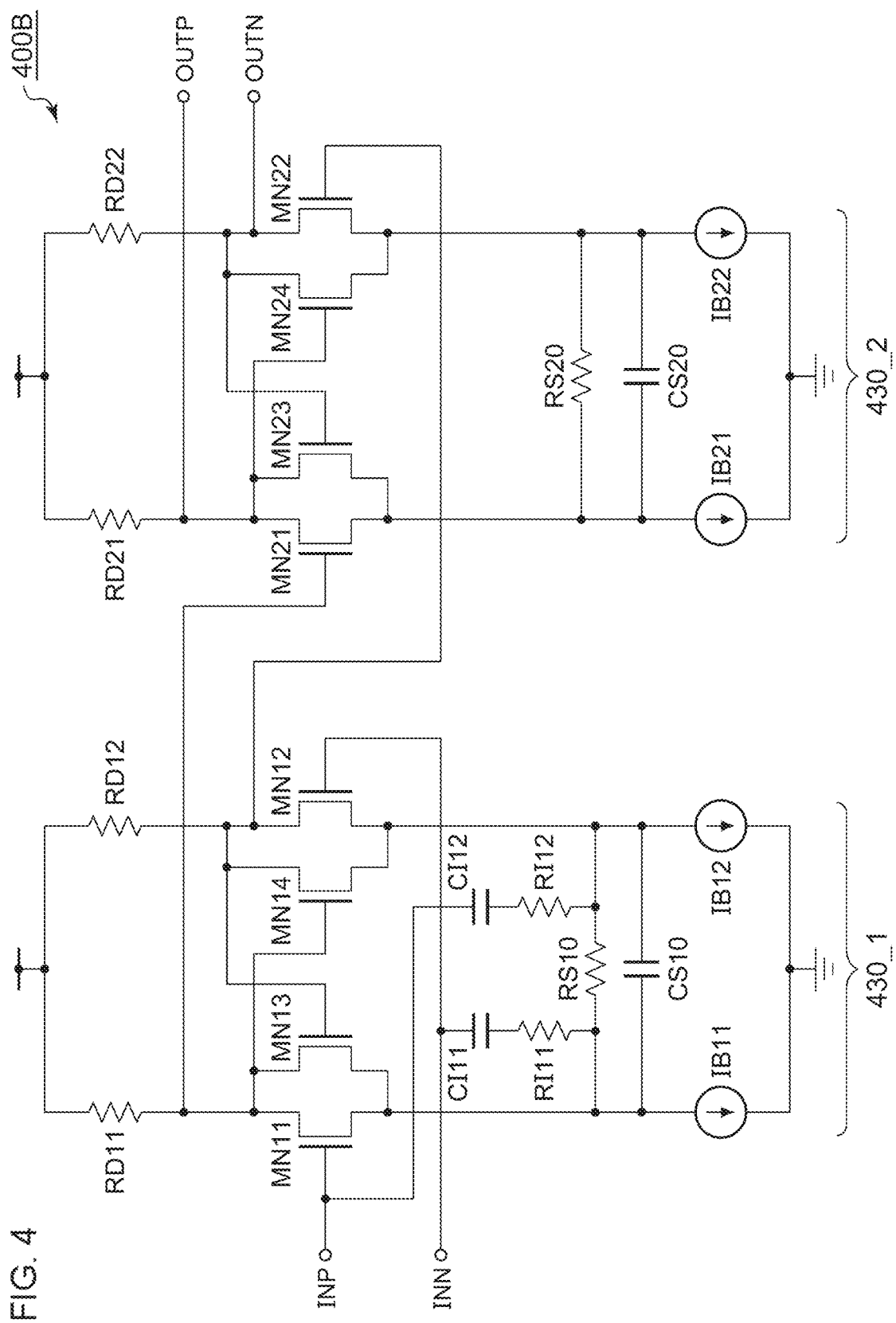
FIG. 4 is a circuit diagram of a differential interface circuit according to Embodiment 2.

FIG. 4 is a circuit diagram of a differential interface circuit 400B according to Embodiment 2. The differential interface circuit 400B has a plurality of stages 430_1 to 430_N. The number of stages N is possibly two, or three or more, and now a structure with N=2 will be illustrated. When N≥3 holds, a structure same as the second stage 430_2 may be repeatedly arranged.

In the second and subsequent stages, a stage 430_i (i=2, . . . N) is structured similarly to the stage 420_i (i=2, . . . N) in FIG. 3, while the first stage 430_1 is structured differently from the first stage 420_1 in FIG. 3.

The first stage 430_1 in FIG. 4 has a structure of the first stage 420_1 in FIG. 3, to which a seventh resistor RI11 and an eighth resistor RI12 were further added. The seventh resistor RI11 is coupled between the differential input terminal INN and the source of the first transistor MN11, in series with the first capacitor CI11. The eighth resistor RI12 is coupled between the differential input terminal INP and the source of the second transistor MN12, in series with the second capacitor CI12.

The differential interface circuit 400B is thus structured. The differential interface circuit 400B having the resistors RI11, RI12 thus added thereto, and used in single-ended transmission, can finely match the source phase of the transistor MN11 on the signal input side, with the source phase of the transistor MN12 on the non-signal input side.

Next, modifications of the differential interface circuits 400A and 400B will be explained.

Modified Example 1

Having described the differential interface circuits 400A and 400B in the embodiments, the capacitors CS10 and CS20 that constitute the filter elements FIL are omissible. That is, the present disclosure does not essentially need the equalizing function and is merely applicable to the differential interface circuit.

Alternatively, only the capacitor CS10 in the first stage is omissible, while leaving the capacitors CS20 in the second and subsequent stages.

Modified Example 2

The differential interface circuit may alternatively employ the structure of the first stage 420_1 or 430_1 only for the first stage, and any other stage for the second and subsequent stages.

Modified Example 3

The transistors MN11, MN12, having described but not restrictively as NMOS transistors in the embodiments, may alternatively be PMOS transistors. In this case, top-bottom (power supply and ground) inversion will suffice.

Applications

Figure 5:
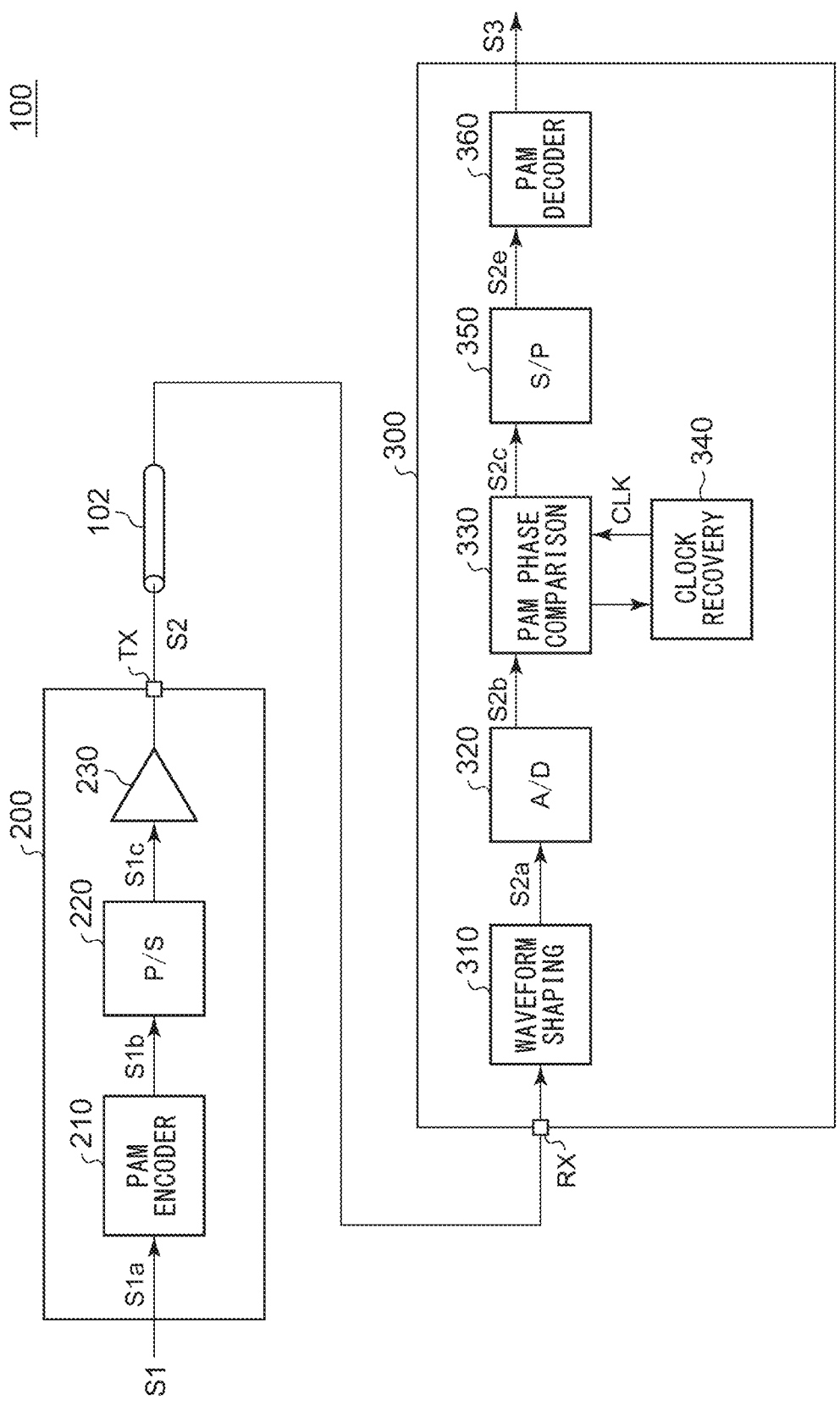
FIG. 5 is a block diagram of a transmission system of an N-level PAM (PAM-N) signal according to an embodiment.

FIG. 5 is a block diagram of a transmission system 100 of an N-level PAM (PAM-N) signal according to an embodiment. The transmission system 100 has a transmitter 200, and a receiver (de-serializer) 300. The transmitter 200 and the receiver 300 are coupled with a transmission cable 102.

Transmitter

The transmitter 200 is a serializer integrated circuit (IC) that receives, from an unillustrated external circuit, data S1 to be transmitted to the receiver 300, converts the data S1 into an N-value PAM signal S2, and transmits it to the receiver 300. The parallel data S1 may be of any type and is exemplified by image data whose large size needs to be transmitted at high speed.

Receiver

The receiver 300 is a de-serializer IC that receives a PAM-N signal S2 from the transmitter 200, and outputs it as output data S3 to some other external circuit not illustrated. Signal transmission between the transmitter 200 and the receiver 300 may rely upon differential signal, or upon single-ended signal.

Although the description below will deal with 4-level (N=4) PAM (PAM4) as an exemplary case of the PAM-N signal, the present disclosure is also applicable to 8-level, 16-level, or 64-level signal without limitation on the number of gradations of the PAM signal.

First, a configuration of the transmitter 200 will be described. A PAM encoder 210 converts data S1a into data S1b in the PAM format. The data S1b has a clock signal embedded in the PAM encoder 210. The PAM encoder 210 can employ an encoding method not particularly limited, which includes DC balanced encoding method such as 8b10b, 10b12b, and 64b66b.

A P/S converter 220 converts the data S1b generated by the PAM encoder 210 into serial data S1c. A PAM driver 230 converts the serial data S1c into the analog PAM-N signal S2, and outputs it.

Next, a configuration of the receiver 300 will be explained. The receiver 300 includes a waveform shaping circuit 310, an A/D converter 320, a PAM phase comparator 330, a clock recovery circuit 340, an S/P converter 350, and a PAM decoder 360.

The PAM-N signal S2 would cause waveform distortion while transmitting through the transmission cable 102. The waveform shaping circuit 310 is provided for improving the waveform distortion. Causes for the waveform distortion are exemplified by attenuation due to transmission loss, and low-pass action of the transmission cable 102. The waveform shaping circuit 310 shapes the waveform of the PAM-N signal S2 to get closer to an ideal PAM signal.

The waveform shaping circuit 310 may have a variable gain amplification (VGA) function that amplifies the PAM-N signal S2 with a variable gain to control the direct current (DC) amplitude of the PAM-N signal S2, and an equalizing (EQ) function that corrects a frequency characteristic of the PAM-N signal S2.

The A/D converter 320 quantizes a PAM-N signal S2a having the waveform shaped by the waveform shaping circuit 310 and converts it into a comparison signal S2b.

The PAM phase comparator 330 receives the comparison signal S2b and latches a plurality of bits b1 to b3 that constitute the comparison signal S2b, in synchronization with a clock signal CLK (data strobe signal) generated by the clock recovery circuit 340. The PAM phase comparator 330 then converts the comparison signal S2b latched by the clock signal CLK into a 2-bit binary code (symbol data) S2c.

The S/P converter 350 converts the binary code S2c into parallel data S2e. The PAM decoder 360 takes part in a process reverse to that of the PAM encoder 210 in the transmitter 200, that is, decodes the parallel data S2e after the DC balanced encoding, and outputs data S3.

The aforementioned differential interface circuits 400A, 400B are applicable to the first stage of the receiver 300, and more specifically, suitably applicable to the input stage of the waveform shaping circuit 310.

Supplement

In one aspect, the technology disclosed in the present specification may be understood as follows.

Item 1

A differential interface circuit comprising:
a first input terminal;
a second input terminal; and
a first stage;
the first stage comprising:
a first transistor having a gate coupled to the first input terminal;
a second transistor having a gate coupled to the second input terminal;
a first resistor coupled to a drain of the first transistor;
a second resistor coupled to a drain of the second transistor;
a first current source coupled to a source of the first transistor;
a second current source coupled to a source of the second transistor;
a third resistor coupled between the source of the first transistor and the source of the second transistor;
a third transistor coupled in parallel with the first transistor and having a gate coupled to the drain of the second transistor; and
a fourth transistor coupled in parallel with the second transistor and having a gate coupled to the drain of the first transistor; and
a first capacitor coupled between the second input terminal and the source of the first transistor; and
a second capacitor coupled between the first input terminal and the source of the second transistor.

Item 2

The differential interface circuit according to item 1, wherein the first stage further comprises a third capacitor coupled in parallel with the third resistor.

Item 3

The differential interface circuit according to item 1 or 2, wherein the first stage further comprises:
a seventh resistor coupled in series with the first capacitor, between the second input terminal and the source of the first transistor; and
an eighth resistor coupled in series with the second capacitor, between the first input terminal and the source of the second transistor.

Item 4

The differential interface circuit according to any one of items 1 to 3, further comprising a second stage coupled to the output stage of the first stage,
the second stage comprising:
a fifth transistor having a gate coupled to the drain of the first transistor;
a sixth transistor having a gate coupled to the drain of the second transistor;
a fourth resistor coupled to a drain of the fifth transistor;
a fifth resistor coupled to a drain of the sixth transistor;
a third current source coupled to a source of the fifth transistor;
a fourth current source coupled to a source of the sixth transistor;
a sixth resistor coupled between the source of the fifth transistor and the source of the sixth transistor;
a seventh transistor coupled in parallel with the fifth transistor and having a gate coupled to the drain of the sixth transistor; and
an eighth transistor coupled in parallel with the sixth transistor and having a gate coupled to the drain of the fifth transistor.

Item 5

The differential interface circuit according to item 4, wherein the second stage further comprises a fourth capacitor coupled in parallel with the sixth resistor.

Item 6

The differential interface circuit according to any one of items 1 to 5, being integrally mounted on one semiconductor substrate.

Item 7

A multi-value pulse amplitude modulation (PAM) signal receiver having the differential interface circuit described in any one of items 1 to 6.

Having described the embodiments according to the present disclosure with use of specific terms, the description is merely illustrative for better understanding, and by no means limits the disclosure or the claims. The scope of the present invention is defined by the claims, and therefore encompasses any embodiment, example, and modified example having not been described above.

What is claimed is:
1. A differential interface circuit comprising:
a first input terminal;
a second input terminal; and
a first stage;
the first stage comprising:
a first transistor having a gate coupled to the first input terminal;
a second transistor having a gate coupled to the second input terminal;
a first resistor coupled to a drain of the first transistor;
a second resistor coupled to a drain of the second transistor;
a first current source coupled to a source of the first transistor;
a second current source coupled to a source of the second transistor;
a third resistor coupled between the source of the first transistor and the source of the second transistor;
a third transistor coupled in parallel with the first transistor and having a gate coupled to the drain of the second transistor; and
a fourth transistor coupled in parallel with the second transistor and having a gate coupled to the drain of the first transistor; and
a first capacitor coupled between the second input terminal and the source of the first transistor; and
a second capacitor coupled between the first input terminal and the source of the second transistor.

2. The differential interface circuit according to claim 1, wherein the first stage further comprises a third capacitor coupled in parallel with the third resistor.

3. The differential interface circuit according to claim 1, wherein the first stage further comprises:
a seventh resistor coupled in series with the first capacitor, between the second input terminal and the source of the first transistor; and
an eighth resistor coupled in series with the second capacitor, between the first input terminal and the source of the second transistor.

4. The differential interface circuit according to claim 1, further comprising a second stage coupled to the output stage of the first stage,
the second stage comprising:
a fifth transistor having a gate coupled to the drain of the first transistor;
a sixth transistor having a gate coupled to the drain of the second transistor;
a fourth resistor coupled to a drain of the fifth transistor;
a fifth resistor coupled to a drain of the sixth transistor;
a third current source coupled to a source of the fifth transistor;
a fourth current source coupled to a source of the sixth transistor;
a sixth resistor coupled between the source of the fifth transistor and the source of the sixth transistor;
a seventh transistor coupled in parallel with the fifth transistor and having a gate coupled to the drain of the sixth transistor; and
an eighth transistor coupled in parallel with the sixth transistor and having a gate coupled to the drain of the fifth transistor.

5. The differential interface circuit according to claim 4, wherein the second stage further comprises a fourth capacitor coupled in parallel with the sixth resistor.

6. The differential interface circuit according to claim 1, being integrally mounted on one semiconductor substrate.

7. A multi-value pulse amplitude modulation (PAM) signal receiver having the differential interface circuit described in claim 1.

* * * * *